United States Patent
Nanba et al.

(10) Patent No.: US 8,479,753 B2
(45) Date of Patent: Jul. 9, 2013

(54) LIQUID PROCESSING APPARATUS AND METHOD

(75) Inventors: Hiromitsu Nanba, Koshi (JP); Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1466 days.

(21) Appl. No.: 11/808,855

(22) Filed: Jun. 13, 2007

(65) Prior Publication Data

US 2007/0289528 A1 Dec. 20, 2007

(30) Foreign Application Priority Data

Jun. 16, 2006 (JP) ................................. 2006-167972

(51) Int. Cl.
*B08B 3/00* (2006.01)
(52) U.S. Cl.
USPC ............... 134/137; 134/60; 134/61; 134/62; 134/78; 134/84; 134/85; 134/86; 134/88; 134/91; 134/104.2; 134/135; 134/144; 134/151; 134/155; 134/157; 118/52; 118/326
(58) Field of Classification Search
USPC ................. 118/52, 118; 134/60, 61, 62, 78, 134/84, 85, 86, 88, 91, 104.2, 135, 137, 144, 134/151, 155, 157, 10, 34, 32, 33
See application file for complete search history.

(56) References Cited

U.S. PATENT DOCUMENTS

| 5,688,322 A | * | 11/1997 | Motoda et al. | 118/52 |
| 5,695,817 A | * | 12/1997 | Tateyama et al. | 427/240 |
| 5,718,763 A | | 2/1998 | Tateyama et al. | |
| 5,803,970 A | * | 9/1998 | Tateyama et al. | 118/319 |
| 6,401,734 B1 | * | 6/2002 | Morita et al. | 134/153 |
| 6,447,608 B1 | * | 9/2002 | Sakai et al. | 118/52 |

FOREIGN PATENT DOCUMENTS

| JP | 08-001064 | 1/1996 |
| JP | 9-45750 | 2/1997 |
| JP | 10-150015 | 6/1998 |
| JP | 2000-182948 | 6/2000 |
| JP | 2002-177856 | 6/2002 |
| JP | 2003-93979 | 4/2003 |

OTHER PUBLICATIONS

European Search Report.
Chinese Office Action issued on Aug. 29, 2008.

(Continued)

*Primary Examiner* — Michael Kornakov
*Assistant Examiner* — Katelyn Whatley
(74) *Attorney, Agent, or Firm* — Smith, Gambrell & Russell, LLP

(57) ABSTRACT

A liquid processing apparatus includes a substrate holding member configured to rotate along with a substrate held thereon in a horizontal state; an annular rotary cup configured to surround the substrate held on the substrate holding member and to rotate along with the substrate; a rotation mechanism configured to integrally rotate the rotary cup and the substrate holding member; and a liquid supply mechanism configured to supply a process liquid onto the substrate. The apparatus further includes an annular drain cup configured to receive the process liquid discharged from the rotary cup, and provided with a drain port; and a circular flow generation element configured to generate a circular flow within the drain cup when the rotary cup and the substrate holding member are rotated, such that the circular flow serves to lead the process liquid within the drain cup to the drain port.

13 Claims, 6 Drawing Sheets

OTHER PUBLICATIONS

Copending Application, filed concurrently (Jun. 13, 2007), "Liquid Processing Apparatus".

Japanese Office Action mailed on Jun. 21, 2011 for Application No. 2007-156157 with English translation.

* cited by examiner

LIQUID PROCESSING APPARATUS AND METHOD

BACKGROUND OF THE INVENTION

1. Field of the Invention

The present invention relates to a liquid processing apparatus and liquid processing method for performing a predetermined liquid process on a substrate, such as a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate, and a coating process for applying a photo-resist liquid or development liquid in a photolithography stage.

As a liquid processing apparatus used for this purpose, the following apparatus of the single-substrate processing type is known. Specifically, a substrate, such as a semiconductor wafer, is held on a spin chuck, and a process liquid is supplied onto the front surface or front and back surfaces of the wafer, while the wafer is rotated. Consequently, a liquid film is formed on the front surface or front and back surfaces of the wafer, thereby performing a process.

In general, an apparatus of this kind is arranged to supply a process liquid onto the center of a wafer, and rotate the wafer to spread the process liquid outward, thereby forming a liquid film and throwing off the process liquid. A surrounding member, such as a cup, is disposed around the wafer to guide downward the process liquid thrown off from the wafer, so that the process liquid is swiftly drained. However, where such a cup or the like is used, part of the process liquid may bounce back to the wafer as mist, and generate defects thereon, such as water marks and/or particles.

As a technique for preventing this problem, Jpn. Pat. Appln. KOKAI Publication No. 8-1064 discloses a technique which utilizes a process liquid receiving member to be rotated integrally with rotary support means that rotates along with a substrate held thereon in a horizontal state. The process liquid receiving member receives a process liquid scattered around the substrate, and guides the process liquid outward to collect it. According to this publication, the process liquid receiving member includes a horizontal eaves portion, an inclined guide portion for guiding the process liquid outward and downward, a horizontal guide portion for guiding the process liquid outward in the horizontal direction, and a wall portion extending upward in the vertical direction, in this order from the substrate side. With this arrangement, the process liquid is guided into a narrow space to prevent mist from bouncing back onto the substrate, while the process liquid is drained from a drain port formed at a corner of the process receiving member. The process liquid is then discharged through grooves extending outward within a spacer disposed around the process liquid receiving member.

In the case of the apparatus described above which utilizes a process liquid receiving member to be rotated integrally with rotary support means, drainage is radially discharged all around from the liquid receiving member due to the rotation thereof, and thus an annular drain cup needs to be disposed to receive the drainage. However, the annular drain cup thus disposed prolongs the time necessary for removing the drainage from the drain cup through a drain port, and thereby brings about the following problems particularly where process liquids of different kinds are employed.

i) In general, where process liquids of different kinds are employed, they are directed to separate drain passages by switching after use. However, if the time length is long from the time switching on the supply side is performed for each process liquid to the time the process liquid is discharged from a drain port, it becomes very difficult to find the timing of switching between drain passages.

ii) Even after switching on the supply side is performed for each process liquid, the former process liquid is still left in the drain cup. Consequently, these two process liquids of different kinds used before and after the switching therebetween are drained together in a mixed state.

BRIEF SUMMARY OF THE INVENTION

An object of the present invention is to provide a liquid processing apparatus and liquid processing method that allow a process liquid to be swiftly discharged from a drain cup.

According to a first aspect of the present invention, there is provided a liquid processing apparatus comprising: a substrate holding member configured to rotate along with a substrate held thereon in a horizontal state; an annular rotary cup configured to surround the substrate held on the substrate holding member and to rotate along with the substrate; a rotation mechanism configured to integrally rotate the rotary cup and the substrate holding member; a liquid supply mechanism configured to supply a process liquid onto the substrate; a drain cup having an annular shape corresponding to the rotary cup and configured to receive the process liquid discharged from the rotary cup, the drain cup being provided with a drain port to discharge the process liquid thus received; and a circular flow generation element configured to generate a circular flow within the drain cup when the rotary cup and the substrate holding member are rotated, such that the circular flow serves to lead the process liquid within the drain cup to the drain port.

In the first aspect, it may be arranged such that the circular flow generation element is inserted into the drain cup and is configured to rotate along with the rotary cup and the substrate holding member. The circular flow generation element may be formed on the rotary cup. In this case, the rotary cup may include an eaves portion configured to cover an area above an end of the substrate held on the substrate holding member, and an outer wall portion connected to the eaves portion to surround the substrate. The circular flow generation element may be connected to the outer wall portion and extend downward into the drain cup. The circular flow generation element may have a cylindrical shape extending along the drain cup.

The drain cup may include a downward slope extending in an annular direction to cause the process liquid to flow into the drain port. The downward slope may have a predetermined length in the annular direction in front of the drain port for the process liquid to flow therethrough. In may be arranged such that the drain port is provided with a guide wall portion opposite the downward slope, and the guide wall portion is inclined relative to a vertical line in a direction to be away from the downward slope. In this case, an angle θ of the guide wall portion relative to the vertical line may satisfy 0°<θ<90°. The guide wall portion may be formed to have an upper end located above a terminal end of the downward slope.

The drain cup may include a bottom portion inclined radially inward. The apparatus may further comprise an exhaust cup surrounding the drain cup and configured to mainly collect and discharge a gas component from inside and around the rotary cup.

It may be arranged such that the circular flow generation element comprises a cylindrical wall extending along an inner surface of the drain cup, and the cylindrical wall has an inner surface having no substantial projections protruding radially inward within the drain cup. In this case, the inner surface of the cylindrical wall may be terminated at a lower end with a tapered portion inclined radially outward and downward toward the inner surface of the drain cup. The tapered portion of the inner surface of the cylindrical wall may be located substantially below a back surface of the substrate held on the substrate holding member.

According to a second aspect of the present invention, there is provided a liquid processing method performed in a liquid processing apparatus comprising a substrate holding member configured to rotate along with a substrate held thereon in a horizontal state; an annular rotary cup configured to surround the substrate held on the substrate holding member and to rotate along with the substrate; a rotation mechanism configured to integrally rotate the rotary cup and the substrate holding member; a liquid supply mechanism configured to supply a process liquid onto the substrate; and a drain cup having an annular shape corresponding to the rotary cup and configured to receive the process liquid discharged from the rotary cup, the drain cup being provided with a drain port to discharge the process liquid thus received, the method comprising: supplying the process liquid onto the substrate held on the substrate holding member; rotating the rotary cup and the substrate holding member, thereby rotating the substrate with the process liquid supplied thereon; receiving by the drain cup the process liquid discharged from the rotary cup; and generating a circular flow within the drain cup when rotating the rotary cup and the substrate holding member, such that the circular flow serves to lead the process liquid within the drain cup to the drain port.

In the second aspect, it may be arranged such that the circular flow is generated by a circular flow generation element inserted into the drain cup and configured to rotate along with the rotary cup and the substrate holding member, and the circular flow is controlled by adjusting height of a lower end of the circular flow generation element from the drain cup bottom portion and a rotational speed of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
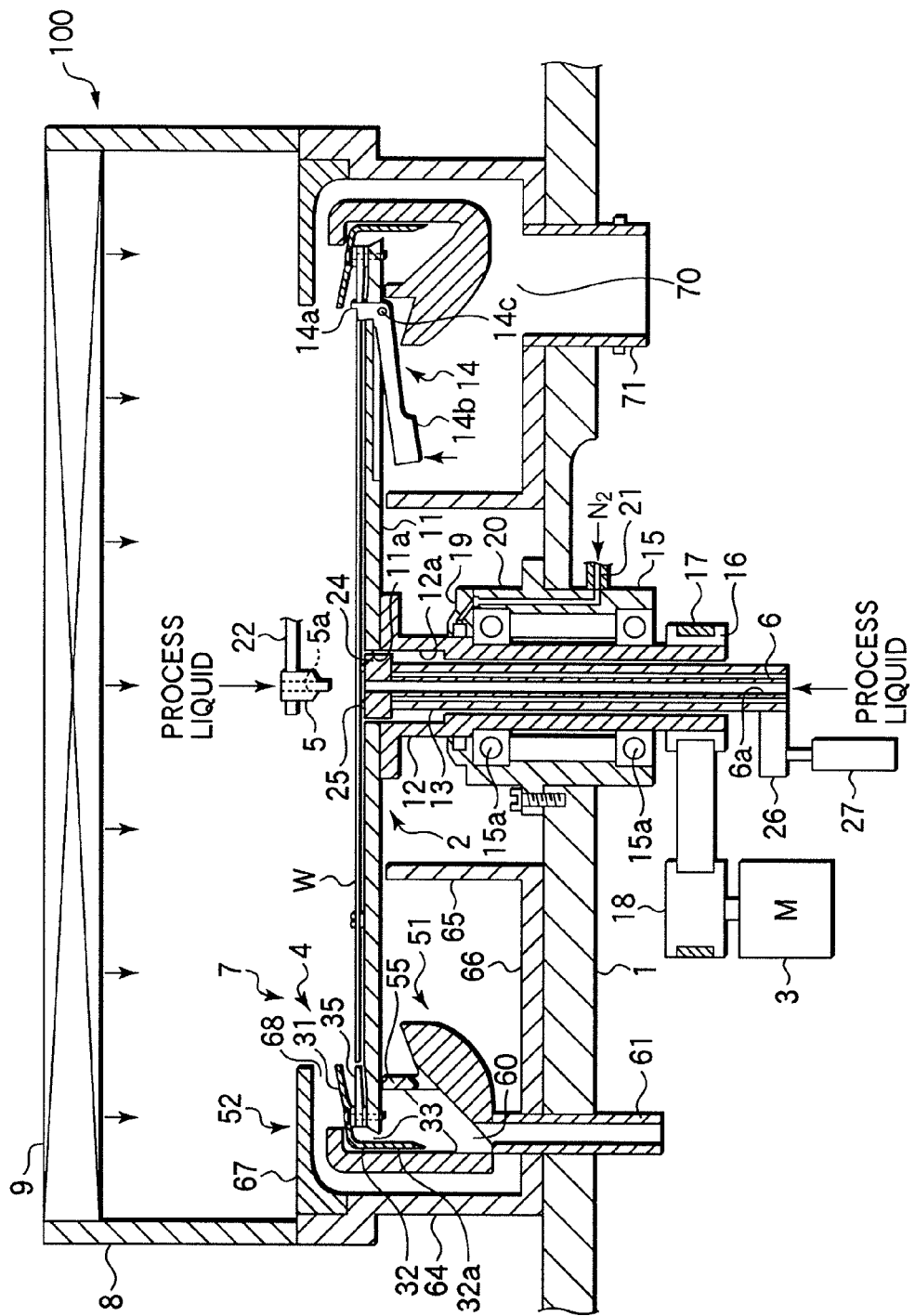
FIG. 1 is a sectional view schematically showing the structure of a liquid processing apparatus according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 2:
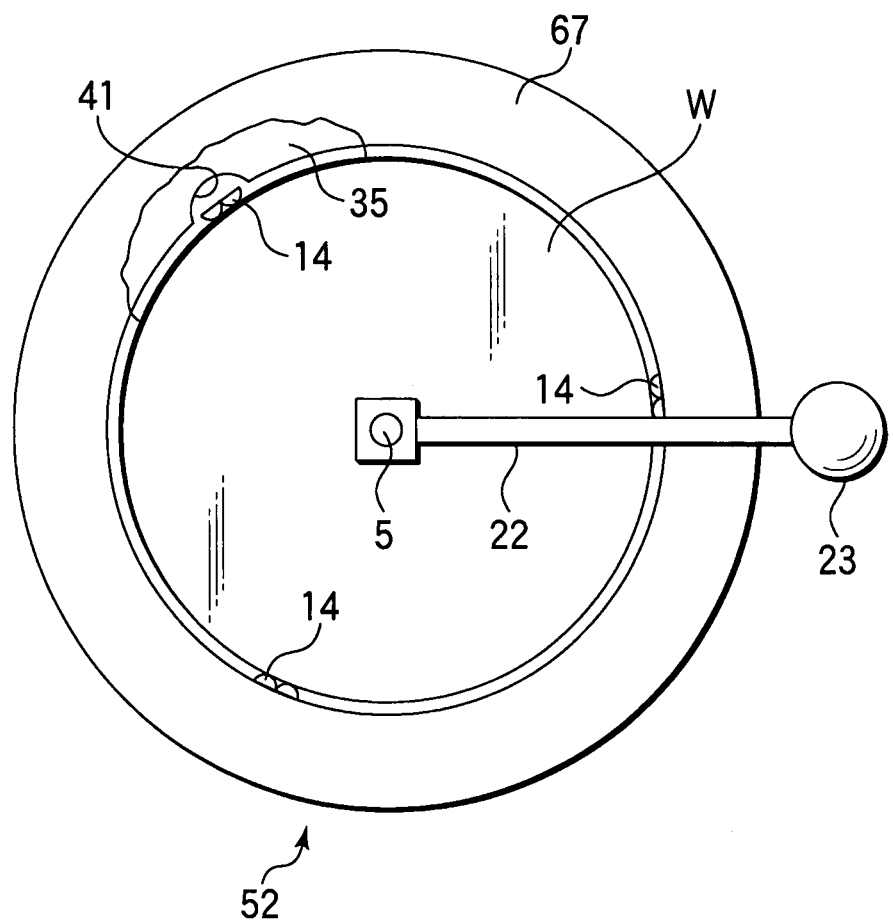
FIG. 2 is a partially sectional plan view schematically showing the liquid processing apparatus according to the embodiment of the present invention.
Figure 3:
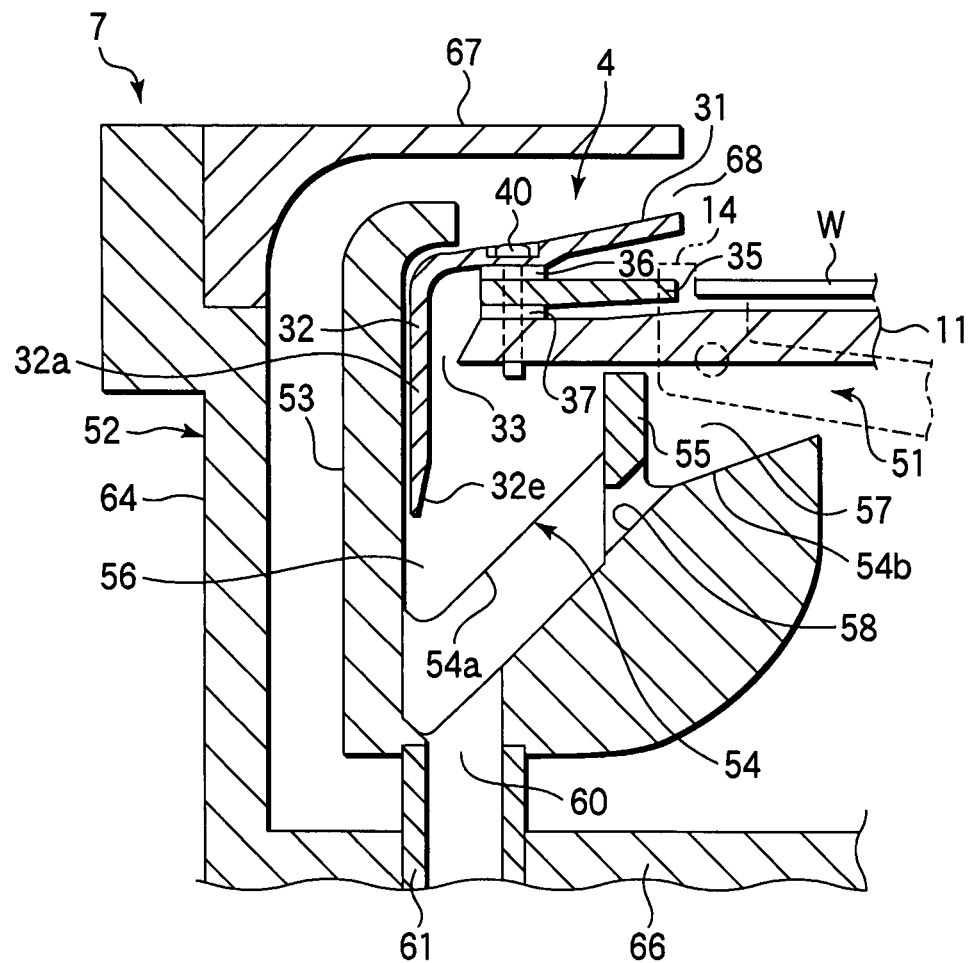
FIG. 3 is an enlarged sectional view showing an exhaust/drain section used in the liquid processing apparatus shown in FIG. 1.

FIG. 1 is a sectional view schematically showing the structure of a liquid processing apparatus according to an embodiment of the present invention. FIG. 2 is a plan view thereof, and FIG. 3 is an enlarged sectional view of an exhaust/drain section. This liquid processing apparatus 100 includes a base plate 1 and a wafer holding member 2 for rotatably holding a target substrate or wafer W. The wafer holding member 2 is rotatable by a rotary motor 3. A rotary cup 4 is disposed around the wafer W held on the wafer holding member 2 and configured to rotate along with the wafer holding member 2. The liquid processing apparatus 100 further includes a front surface process liquid supply nozzle 5 for supplying a process liquid onto the front surface of the wafer W, and a back surface process liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a fan/filter unit (FFU) 9 at the top, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back surface process liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end. The shaft of the motor 3 is also provided with a pulley 18 fitted thereon. A belt 17 is wound around between these pulleys 16 and 18. The rotary shaft 12 is rotated through the pulley 18, belt 17, and pulley 16 by rotation of the motor 3.

An annular purge gas supply port 19 is disposed directly above the bearing mechanism 15 to surround the outer surface of the rotary shaft 12. The purge gas supply port 19 is connected to a purge gas passage 20 formed in the outer wall of the bearing mechanism 15 and extends in a vertical direction. The purge gas passage 20 is connected to a purge gas tube 21 at a position below the base plate 1 of the bearing mechanism 15. A purge gas, such as $N_2$ gas, is supplied from a purge gas supply source (not shown) through the purge gas tube 21 and purge gas passage 20 to the purge gas supply port 19. Then, the purge gas is supplied from the purge gas supply port 19 and flows upward and downward along the rotary shaft 12. Consequently, mist is prevented from depositing on the upper side of the rotary shaft 12, and particles generated by the bearing 15a are prevented from reaching the wafer W.

The front surface process liquid supply nozzle 5 is supported by a nozzle arm 22. A process liquid is supplied through a liquid supply tube (not shown) into the nozzle 5 and is then delivered from a nozzle hole 5a formed in the nozzle 5. For example, the process liquid thus delivered encompasses a cleaning chemical solution, a rising liquid such as purified water, and a drying solvent such as IPA. In other words, the nozzle 5 is configured to selectively deliver process liquids of one, two, or more types. As shown in FIG. 2, the nozzle arm 22 is rotatable about a shaft 23 used as a central axis, and is movable by a driving mechanism (not shown) between a delivery position above the center of the wafer W and a retreat position outside the wafer W. Further, the nozzle arm 22 is movable up and down, such that the arm 22 is set at an upper position when it is rotated between the retreat position and delivery position, and at a lower position when a process liquid is delivered from the front surface process liquid supply nozzle 5.

The back surface process liquid supply nozzle 6 has a nozzle hole 6a formed through the center of the elevating member 13 and extending in the longitudinal direction. A predetermined process liquid is supplied through a process liquid tube (not shown) into the nozzle hole 6a from below and is then delivered from the nozzle hole 6a onto the back surface of the wafer W. For example, the process liquid thus delivered encompasses a cleaning chemical solution, a rising liquid such as purified water, and a drying solvent such as IPA, as in the front surface process liquid supply nozzle 5. In other words, the nozzle 6 is configured to selectively deliver process liquids of one, two, or more types. The elevating member 13 includes a wafer support head 24 at the top for supporting the wafer W. The wafer support head 24 is provided with three wafer support pins 25 for supporting the wafer W (only two of them are shown) on the upper surface. The lower end of the back surface process liquid supply nozzle 6 is connected to a cylinder mechanism 27 through a connector 26. The elevating member 13 is movable up and down by the cylinder mechanism 27 to move up and down the wafer W for loading and unloading the wafer W.

As shown in FIG. 3, the rotary cup 4 includes an annular eaves portion 31 inclined to extend inward and upward from a position above the end of the rotary plate 11 and a cylindrical outer wall portion 32 extending vertically downward from the outer end of the eaves portion 31. An annular gap 33 is formed between the outer wall portion 32 and rotary plate 11, so that a process liquid (mist) scattered by rotation of the wafer W along with the rotary plate 11 and rotary cup 4 is guided downward through the gap 33. Further, as described later, a circular flow generation element 32a having a cylindrical shape is formed integrally with the outer wall portion 32 and extends downward below the rotary plate 11.

Figure 4:
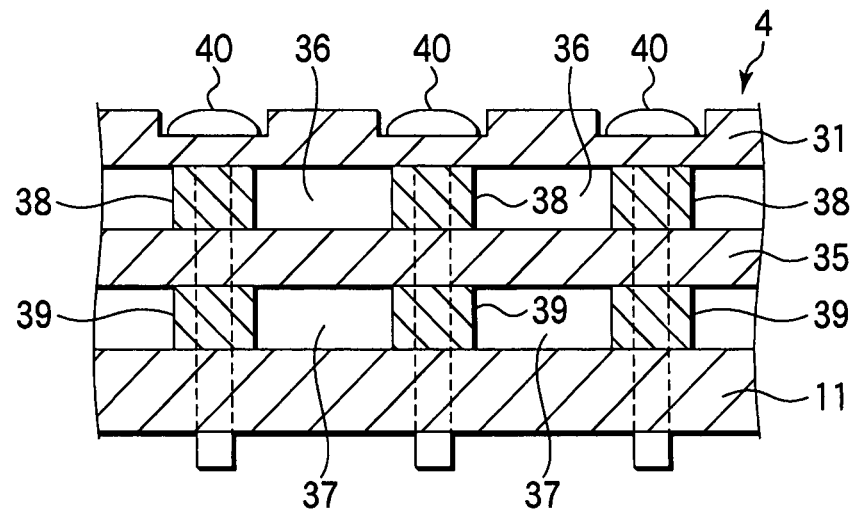
FIG. 4 is a view for explaining the arrangement of a rotary cup and a guide member used in the liquid processing apparatus shown in FIG. 1.

A plate-like guide member 35 is disposed between the eaves portion 31 and rotary plate 11 at a height essentially the same as the wafer W. As shown in FIG. 4, a plurality of spacers 38 and 39 are disposed in an annular direction between the eaves portion 31 and guide member 35 and between the guide member 35 and rotary plate 11 to form openings 36 and 37 for allowing the process liquid to pass therethrough. The eaves portion 31, guide member 35, rotary plate 11, and spacers 38 and 39 are fixed to each other by screws 40.

The guide member 35 is arranged such that the upper and lower surfaces thereof are to be almost continued to the front and back surfaces of the wafer W. When a process liquid is supplied onto the center of the front surface of the wafer W from the front surface process liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35 almost continued thereto. Then, the process liquid is discharged outward through the openings 36, and is guided downward by the eaves portion 31 and outer wall portion 32. Similarly, when a process liquid is supplied onto the center of the back surface of the wafer W from the back surface process liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 35 almost continued thereto. Then, the process liquid is discharged outward through the openings 37, and is guided downward by the eaves portion 31 and outer wall portion 32. At this time, since a centrifugal force acts on the process liquid guided to the spacers 38 and 39 and outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup while preventing the process liquid from being turned into mist. As shown in FIG. 2, the guide member 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 3, the exhaust/drain section 7 includes an annular drain cup 51 disposed to receive the process liquid discharged from the rotary cup 4, and an annular exhaust cup 52 disposed outside the drain cup 51 to surround the drain cup 51.

As shown in FIGS. 1 and 3, the drain cup 51 includes a vertical wall 53 disposed outside the rotary cup 4 very closely to the outer wall portion 32, and a bottom portion 54 extending inward from the lower end of the vertical wall 53. The upper side of the vertical wall 53 extends to a position above the outer wall portion 32 of the rotary cup 4 and is curved along the eaves portion 31. This arrangement is conceived to prevent mist from flowing backward from inside the drain cup 51 toward the wafer W. The drain cup 51 further includes an annular partition wall 55 disposed therein in an annular direction outside the holding accessories 14 and extending from the bottom portion 54 to a position near the lower surface of the rotary plate 11. The interior of the drain cup 51 is divided by the partition wall 55 into a main cup portion 56 and an auxiliary cup portion 57. The main cup portion 56 is used to receive the process liquid discharged from the gap 33, while the auxiliary cup portion 57 is used to receive the process liquid dropping from portions near the holding portions 14a of the holding accessories 14. The bottom portion 54 is divided by the partition wall 55 into a first portion 54a corresponding to the main cup portion 56 and a second portion 54b corresponding to the auxiliary cup portion 57. The first and second portions 54a and 54b are inclined upward and inward (toward the rotational center). The inner side of the second portion 54b extends inward (toward the rotational center) further from a position corresponding to the holding portions 14a of the holding accessories 14. The partition wall 55 serves to prevent a gas flow formed by the portions of the holding accessories 14 protruding downward below the rotary plate 11 from involving and transferring mist onto wafer W. The partition wall 55 has a hole 58 formed therein to guide the process liquid from the auxiliary cup portion 57 to the main cup portion 56.

The drain cup 51 has a drain port 60 formed in the bottom portion 54 at one position on the outermost side and connected to a drain tube 61. The drain tube 61 is connected to a suction mechanism through a drain-switching member (both not shown), so that process liquids are separately collected or discarded in accordance with the types thereof. In place of a single drain port 60, a plurality of drain ports 60 may be formed.

Figure 5:
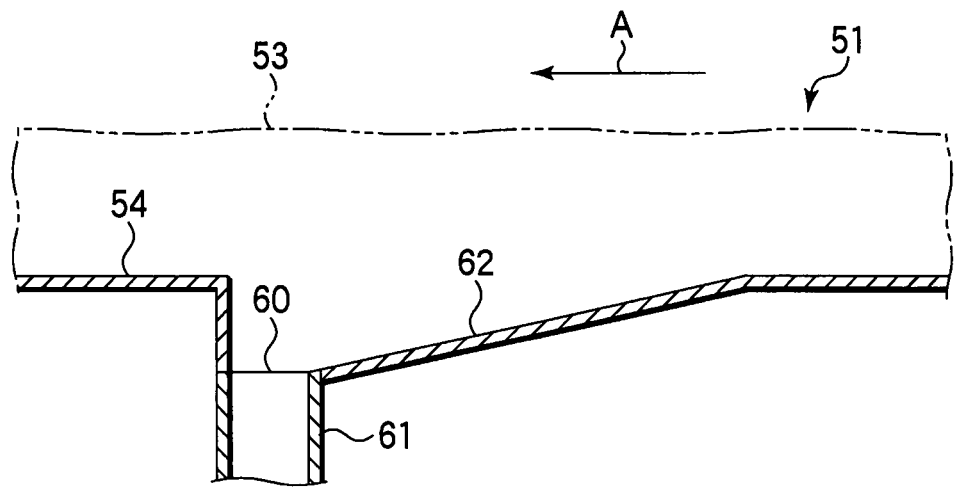
FIG. 5 is a view schematically showing a part of a drain cup used in the liquid processing apparatus shown in FIG. 1.

As shown in FIG. 5, the bottom portion 54 of the drain cup 51 has a structure in an annular direction arranged such that a region from the drain port 60 to a halfway portion, along the rotational direction of the rotary plate 11 indicated by an arrow A, is horizontal, and the following region toward the drain port 60 is formed as a downward slope 62 having a predetermined length. This structure is conceived to facilitate drainage from the drain cup 51. The bottom portion 54 may be formed to have a slope extending in the entire length of the bottom portion 54. However, in this case, the slope needs to be gentle, so the effect of facilitating drainage is deteriorated and the machining thereon becomes difficult. Thus, the slope is preferably formed only within a region in front of the drain port 60 for the process liquid to flow therethrough.

The exhaust cup 52 includes an outer wall 64 vertically extending outside the vertical wall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and a top wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the upper wall 67 and eaves portion 31 of the rotary cup 4. As shown in FIG. 1, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The plurality of exhaust ports 70 can be selectively used by switching in accordance with the types of process liquids.

As described above, the process liquid is guided by the rotary cup 4 to the drain cup 51, and gas components are guided from the inlet port 68 to the exhaust cup 52. In this case, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust port 70, so that the mist is reliably prevented from diffusing outside.

As described previously, the circular flow generation element 32a is formed integrally with the outer wall portion 32 of the rotary cup 4 and, as seen from FIG. 3, extends downward below the rotary plate 11 such that it is the lowermost element of rotary cup 4 within drain cup 51. The circular flow generation element 32a is inserted into the main cup portion 56 of the drain cup 51, and generates a circular flow of air within the main cup portion 56 when it is rotated along with the rotary plate 11. The circular flow thus formed serves to swiftly lead the process liquid discharged in the drain cup 51 to the drain port 60.

Since the circular flow generation element 32a is a part of the outer wall portion 32 of the rotary cup 4, the element 32a is formed of a cylindrical wall extending along the inner surface of the drain cup 51. This cylindrical wall has an inner surface having no substantial projections protruding radially inward within the drain cup 51. The inner surface of the cylindrical wall of the circular flow generation element 32a is terminated at the lower end with a tapered portion 32e inclined radially outward and downward toward the inner surface of the drain cup 51. This arrangement can remove an abrupt step portion between the inner surface of the circular flow generation element 32a and the inner surface of the drain cup 51. Since the circular flow generation element 32a has a smooth inner surface, and the circular flow generation element 32a and drain cup 51 form no step portion therebetween, the process liquid is prevented from being needlessly agitated or thereby generating mist within the drain cup 51. The tapered portion 32e of the circular flow generation element 32a is located sufficiently below the lower surface of the rotary plate 11 that supports the wafer W.

Figure 6A:
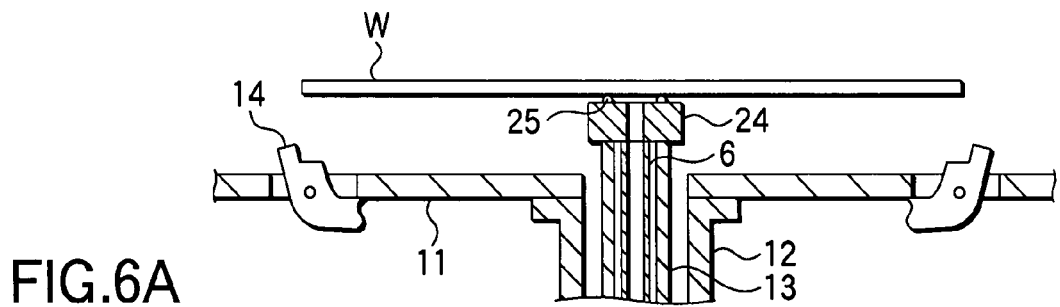
FIGS. 6A to 6D are views for explaining an operation of the liquid processing apparatus according to the embodiment of the present invention.
Figure 6B:
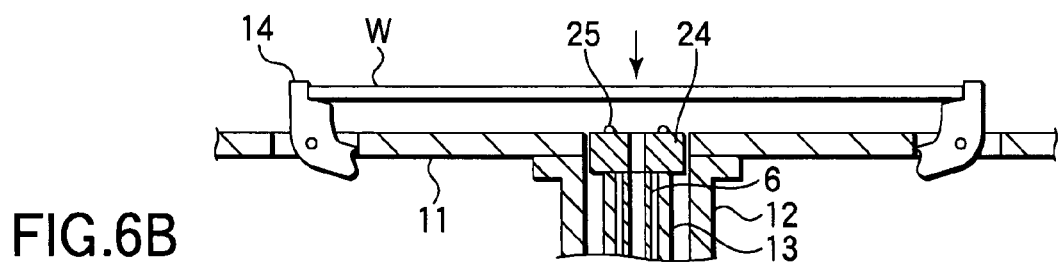
Figure 6C:
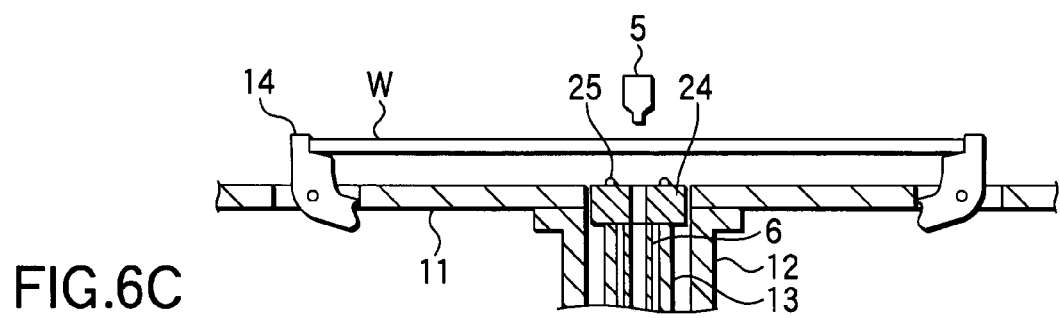

Next, an explanation will be given, with reference to FIGS. 6A to 6D, of an operation of the liquid processing apparatus 100 having the structure described above. At first, as shown in FIG. 6A, the elevating member 13 is set at the upper position, and a wafer W is transferred from a transfer arm (not shown) onto the support pins 25 of the wafer support head 24. Then, as shown in FIG. 6B, the elevating member 13 is moved down to a position where the wafer W can be held by the holding accessories 14, and then the wafer W is chucked by the holding accessories 14. Then, as shown in FIG. 6C, the front surface process liquid supply nozzle 5 is moved from the retreat position to the delivery position above the center of the wafer W.

Figure 6D:
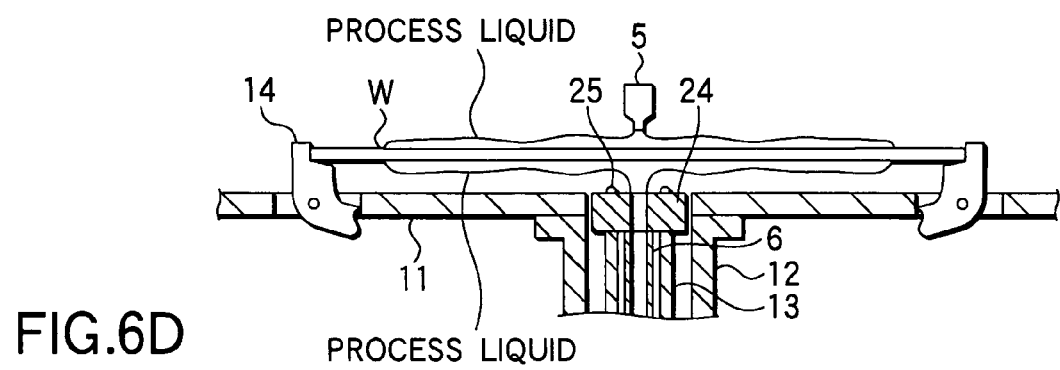

In this state, as shown in FIG. 6D, while the holding member 2 is rotated along with the rotary cup 4 and wafer W by the motor 3, a predetermined process liquid is supplied from the front surface process liquid supply nozzle 5 and back surface process liquid supply nozzle 6 to perform a cleaning process.

In this cleaning process, the process liquid is supplied onto the center of the front surface and back surface of the wafer W, and is spread by a centrifugal force outward on the wafer W and thrown off from the peripheral edge of the wafer W. The cup surrounding the wafer W used in this process is the rotary cup 4 that is rotated along with the wafer W. Accordingly, when the process liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56 of the drain cup 51. Further, since the rotary plate 11 has holes for inserting the holding portions 14a at positions where the holding accessories 14 are attached, the process liquid drops through the holes into the auxiliary cup portion 57 of the drain cup 51.

Figure 7:
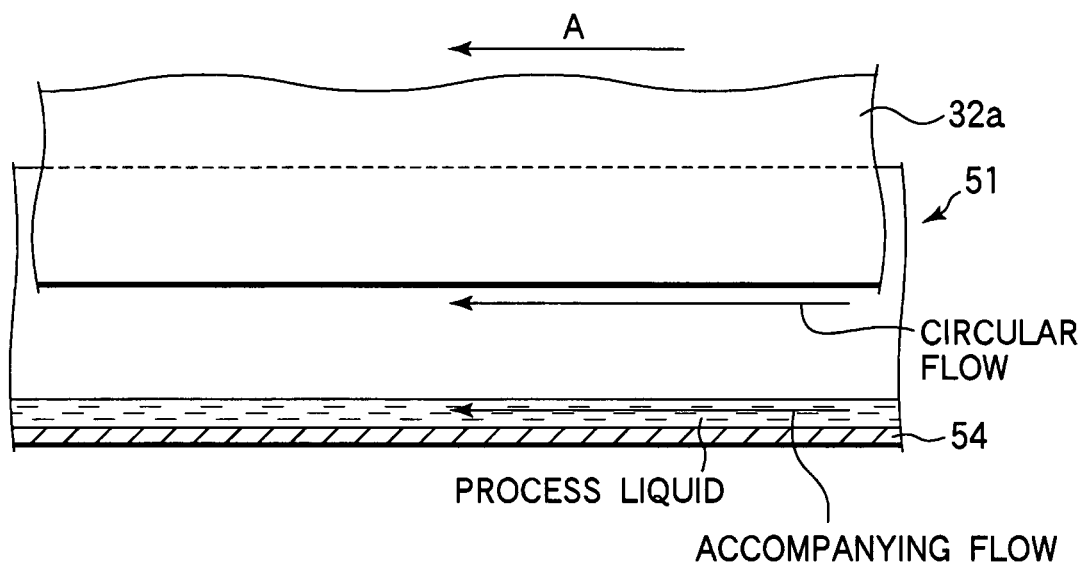
FIG. 7 is a schematic view for explaining the principle of the present invention.

When cleaning is performed on the wafer W, since the process liquid is discharged through the annular gap 33 while the rotary cup 4 is being rotated, the drain cup 51 for receiving the process liquid needs to be annular. Conventionally, such an annular drain cup brings about a problem in that it prolongs the time necessary for removing drainage from the drain cup through a drain port. In this respect, according to this embodiment, the rotary cup 4 is provided with the circular flow generation element 32a to generate a circular flow of air within the drain cup 51 when the wafer W is processed while it is rotated. Consequently, as shown in FIG. 7, an accompanying flow of the process liquid is formed by the circular flow within the drain cup 51, and the process liquid is thereby swiftly led to the drain port 60. Since the process liquid within the drain cup 51 is thus forced to flow toward the drain port 60, the process liquid is discharged from the drain port in a short time.

Where the process liquid is discharged from the annular drain cup 51 in a short time, it becomes easier to find the timing of switching between drain passages of process liquids of different kinds. Further, it is possible to prevent two process liquids of different kinds used before and after the switching therebetween from being drained together in a mixed state.

In this embodiment, the circular flow generation element 32a is formed as a part of the rotary cup 4, so the apparatus is not complicated by an additional special member. The downward slope 62 is formed on the bottom portion 54 of the drain cup 51 only within a region in front of the drain port 60 for the process liquid to flow therethrough, so drainage from the drain cup 51 is facilitated, and the process liquid is thereby discharged in a short time. The bottom portion 54 of the drain cup 51 is inclined radially inward and upward, and the process liquid discharged on an inner side of the bottom portion 54 swiftly flows to an outer side, so residual liquid can be hardly generated.

The flow velocity of the process liquid obtained by a circular flow generated by the circular flow generation element 32a depends on the height of the lower end of the circular flow generation element 32a. Where the lower end position is closer to the bottom portion 54 of the drain cup 51, the flow velocity of the process liquid within drain cup 51 becomes higher. However, it is not preferable to set the lower end at a position too close to the bottom portion 54, because liquid bouncing becomes influential and contaminates the environment, and residual liquid is generated on the bottom portion 54. Accordingly, the height of the lower end of the circular flow generation element 32a is preferably set at a position that allows the process liquid to flow at a suitable flow velocity within the drain cup 51 and allows the liquid bouncing to fall within the allowable range. Further, the effects of generating a circular flow within the drain cup 51 and preventing the liquid bouncing vary also depending on the rotational speed of the circular flow generation element 32a, i.e., the rotational speed of the rotary cup 4. Accordingly, the height of the circular flow generation element 32a needs to be adjusted in light of the rotational speed as well. In the case of 300-mm wafers, the rotational speed of the wafer W is set to be, e.g., 300 to 1200 rpm. Since the rotary cup 4 is rotated at the same speed, the height of the lower end of the circular flow generation element 32a is preferably set to be about 5 to 20 mm from the bottom portion 34.

Figure 8:
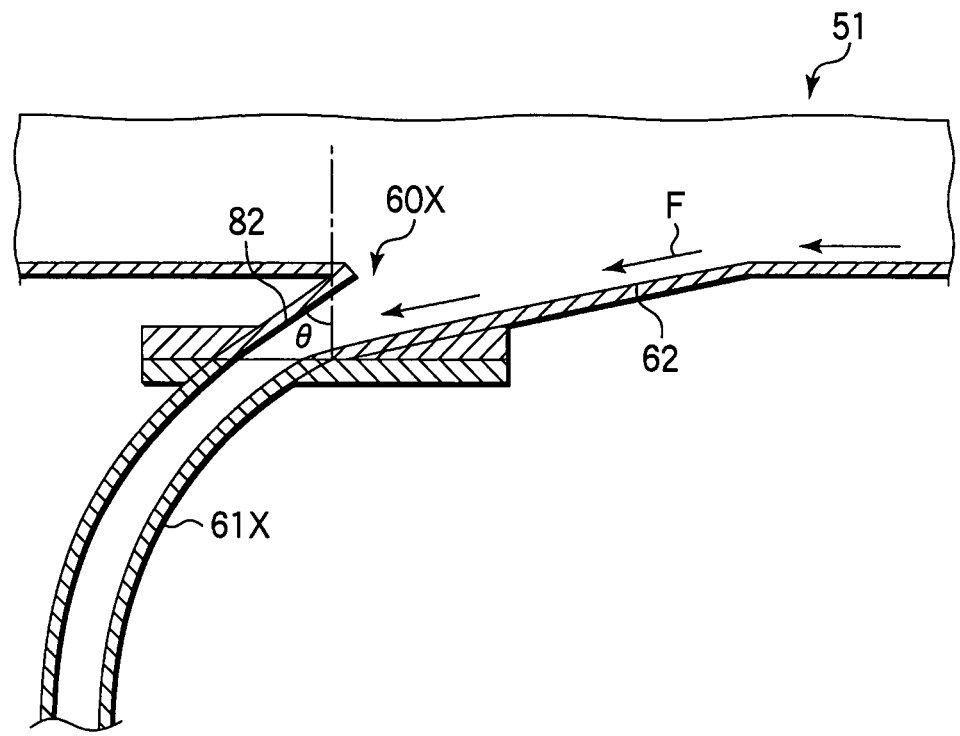
FIG. 8 is a view schematically showing a part of a drain cup according to a modification usable in the liquid processing apparatus shown in FIG. 1.

FIG. 8 is a view schematically showing a part of a drain cup according to a modification usable in the liquid processing apparatus shown in FIG. 1. In this modification, a drain port 60X disposed on the drain cup 51 and a drain tube 61X connected thereto are arranged to be aligned with a flow F of the process liquid generated by the circular flow generation element 32a within the drain cup 51. Specifically, at the drain port 60X, a guide wall portion 82 is disposed opposite the downward slope 62 of the drain cup 51, and is inclined relative to the vertical line in a direction to be away from the downward slope 62. The angle θ of the guide wall portion 82 relative to the vertical line satisfies 0°<θ<90°. The guide wall portion 82 is formed to have an upper end located above the terminal end of the downward slope 62 at the drain port 60X. The drain tube 61X is connected to the drain cup 51 in the same inclined angle as the guide wall portion 82, and is then curved with a large radius of curvature to extend vertically downward.

With this arrangement, the flow F of the process liquid formed by the circular flow generation element 32a within the drain cup 51 is smoothly guided by the guide wall portion 82 from the drain port 60X into the drain tube 61X. Since the guide wall portion 82 is inclined, the process liquid is hardly bouncing back on the guide wall portion 82 when the flow F of the process liquid encounters the guide wall portion 82 at the drain port 60X. Consequently, the process liquid is efficiently guided into the drain tube 61X, while mist generation is prevented.

In the embodiment according to the present invention described above, when the rotary cup and substrate holding member are rotated, a circular flow is formed within the drain cup having an annular shape corresponding to the annular rotary cup. Consequently, an accompanying flow of the process liquid is formed by the circular flow within the drain cup, so the process liquid is thereby led to the drain port and is swiftly discharged from the drain cup.

The present invention is not limited to the embodiment described above, and it may be modified in various manners. For example, the circular flow generation element does not necessarily require to be formed on the rotary cup, but only requires to be formed on a portion rotatable along with the wafer. The embodiment described above is exemplified by a liquid processing apparatus for cleaning the front and back surfaces of a wafer. However, the present invention may be applied to a liquid processing apparatus for cleaning only one of the front surface and back surfaces of a wafer. Further, in place of a cleaning process, the present invention may be applied to a liquid processing apparatus for performing another liquid process, such as a resist liquid coating process and/or a subsequent development process. In the embodiment described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid processing apparatus comprising:
a substrate holding member configured to rotate along with a substrate held thereon in a horizontal state;
an annular rotary cup configured to surround the substrate held on the substrate holding member and to rotate along with the substrate;
a rotation mechanism configured to integrally rotate the rotary cup and the substrate holding member;
a liquid supply mechanism configured to supply a process liquid onto the substrate; and
a drain cup having an annular shape corresponding to the rotary cup and configured to receive the process liquid discharged from the rotary cup, the drain cup being provided with a drain port to discharge the process liquid thus received,
wherein the rotary cup includes an outer wall portion disposed inside a peripheral wall of the drain cup to surround the substrate and equipped with a circular flow generation element integrally formed therewith, the circular flow generation element being the lowermost element of the rotary cup that extends downward from the rotary cup into the drain cup, the outer wall portion and the circular flow generation element forming a cylindrical shape inside the peripheral wall of the drain cup, such that the outer wall portion and the circular flow generation element are arranged to rotate along with the rotary cup and the substrate holding member, relative to the drain cup, and to receive the process liquid thrown off from the substrate by an inner surface of the outer wall portion and guide the process liquid by an inner surface of the circular flow generation element toward a bottom portion of the drain cup, while generating a circular flow by the circular flow generation element within the drain cup, which leads the process liquid on the bottom within the drain cup to the drain port.

2. The liquid processing apparatus according to claim 1, wherein the rotary cup includes an eaves portion configured to cover an area above an end of the substrate held on the substrate holding member, and the outer wall portion integrally is formed with the eaves portion.

3. The liquid processing apparatus according to claim 1, wherein the bottom portion of the drain cup includes a downward slope extending in an annular direction to cause the process liquid to flow into the drain port.

4. The liquid processing apparatus according to claim 3, wherein the downward slope has a predetermined length in the annular direction in front of the drain port for the process liquid to flow therethrough.

5. The liquid processing apparatus according to claim 4, wherein the drain port is provided with a guide wall portion opposite the downward slope, and the guide wall portion is inclined relative to a vertical line in a direction to be away from the downward slope.

6. The liquid processing apparatus according to claim 5, wherein an angle $\Theta$ of the guide wall portion formed in the annular direction relative to the vertical line satisfies $0°<\Theta<90°$.

7. The liquid processing apparatus according to claim 5, wherein the guide wall portion is formed to have an upper end located above a terminal end of the downward slope.

8. The liquid processing apparatus according to claim 1, wherein the bottom portion of the drain cup is inclined radially inward.

9. The liquid processing apparatus according to claim 1, further comprising an exhaust cup surrounding the drain cup and configured to mainly collect and discharge a gas component from inside and around the rotary cup.

10. The liquid processing apparatus according to claim 1, wherein the inner surface of the circular flow generation element has no substantial projections protruding radially inward within the drain cup.

11. The liquid processing apparatus according to claim 10, wherein the inner surface of the circular flow generation element is terminated at a lower end with a tapered portion inclined radially outward and downward toward the inner surface of the peripheral wall of the drain cup.

12. The liquid processing apparatus according to claim 11, wherein the tapered portion of the circular flow generation element is located substantially below a back surface of the substrate held on the substrate holding member.

13. The liquid processing apparatus according to claim 1, wherein a lower end of the circular flow generation element is located below a back surface of the substrate held on the substrate holding member.

* * * * *